United States Patent [19]

Ikeda et al.

[11] Patent Number: 4,737,715

[45] Date of Patent: Apr. 12, 1988

[54] COIL SYSTEM FOR NUCLEAR MAGNETIC RESONANCE SPECTROMETER PROBE

[75] Inventors: Hiroshi Ikeda; Shozo Shimizu; Jun Kida, all of Tokyo, Japan

[73] Assignee: Jeol Ltd., Tokyo, Japan

[21] Appl. No.: 828,196

[22] Filed: Feb. 10, 1986

[30] Foreign Application Priority Data

Feb. 14, 1985 [JP] Japan .................................. 60-26719
Feb. 14, 1985 [JP] Japan .................................. 60-26720

[51] Int. Cl.$^4$ ............................................ G01R 33/20
[52] U.S. Cl. ..................................................... 324/318
[58] Field of Search ............... 324/300, 307, 309, 311, 324/318, 322; 336/DIG. 1; 335/299

[56] References Cited

U.S. PATENT DOCUMENTS 4,563,648  1/1986  Hill ...................................... 324/300

FOREIGN PATENT DOCUMENTS 2151791   7/1985  United Kingdom ................. 324/307
2158249  11/1985  United Kingdom ................. 324/307

OTHER PUBLICATIONS

Alderman et al., "An Efficient Decoupler Coil Design which Reduces Heating in Conductive Samples in Superconducting Spectrometers", Journal of Magnetic Resonance, vol. 36, pp. 447-451, 1979.

D. I. Hoult, "Radio Frequency Coil Technology in NMR Scanning", Proceedings of an International Symposium on NMR Imaging, Wake-Forest University, No. Carolina, Oct., 1981, pp. 33-39.

Primary Examiner—Stewart J. Levy
Assistant Examiner—Kevin D. O'Shea
Attorney, Agent, or Firm—Webb, Burden, Robinson & Webb

[57] ABSTRACT

In a coil system for an NMR spectrometer probe, a coil is wound around a cylindrical volume for containing the sample. The coil is used for producing an RF magnetic field in a direction perpendicular to the axis of the cylindrical volume. Leads from the coil connect it to an external circuit for executing the coil. Two leads are arranged to overlap each other adjacent the cylindrical volume with a dielectric substance sandwiched therebetween. The disclosed coil structure lowers inductance, raises Q value and enables higher tuning frequencies, enhances signal to noise ratios and sensitivity.

6 Claims, 5 Drawing Sheets

COIL SYSTEM FOR NUCLEAR MAGNETIC RESONANCE SPECTROMETER PROBE

BACKGROUND OF THE INVENTION

The present invention relates to a coil system for use in the probe of a nuclear magnetic resonance spectrometer and, more particularly, to a coil structure that provides improved sensitivity in making measurements.

In an NMR spectrometer, a probe holes a sample in place in a uniform static magnetic field. A coil is disposed close to the sample within the probe to apply an exciting RF magnetic field to the sample. The resonance signal originating from the sample is picked up by the coil, and then it is fed to a receiver circuit. The output from the receiver circuit is furnished to a computer, which takes the Fourier transform of the signal to obtain an NMR spectrum. At this time, the sensitivity of the NMR spectrometer depends to a large measure on the degree of coupling between the coil and the resonators of the sample. Therefore, great care is taken in designing the shape and structure of the coil. An NMR spectrometer employing a superconducting magnet to create the static magnetic field has typically used as its probe coil a cylindrical saddle coil as shown in FIG. 1, where two spirally wound coil portions 1 and 2 are symmetrically arranged about the Z-axiz of a cylinder around a cylindrical volume of radius R in which a sample tube holding a sample is disposed. The coil portion 1 consists of straight portions 1A extending parallel to the Z-axis and arc-shaped portions 1B lying in planes that are perpendicular to the Z-axis. Similarly, the coil portion 2 consists of straight portions 2A and arc-shaped portions 2B. FIG. 2 is a cross-sectional view of the straight portions 1A and 2A taken on a plane perpendicular to the Z-axis. It can be seen from this figure that the straight portions 1A and 2A are disposed on the periphery of the circle of the radius R in a symmetrical relation with respect to Y-plane. These coil portions are used to set up an RF magnetic field in the direction of the X-axis.

The concept that underlies the prior art coil system as mentioned above is that two spiral coil portions 1 and 2 of the same shape are disposed on opposite sides of the cylindrical volume in a symmetrical relation with respect to the Y-plane. Consequently, the number of turns of such a coil system is 2, 4, 6, 8 or other even number. The prior art technique described thus far is disclosed in U.S. Pat. No. 4,398,149.

In recent years, static magnetic fields of larger strengths have been obtained by the use of superconducting magnets. As a result, the frequency observed has been raised from about 400 MHz to 500 MHz and 600MHz. In order to raise the frequency in this way, the sample probe coil is required to have a small inductance and a high Q and have the ability to raise the tuning frequency and enhance the signal-to-noise ratio and the sensitivity. Heretofore, a coil system having the least number, i.e., two, of turns as shown in FIG. 1 and showing the minimum value of inductance has been used to satisfy such requirements. However, even this coil system is unable to offer sufficiently low inductance. The present situation is that this coil system is employed with unsatisfactory result.

In view of the foregoing, the present inventors have already proposed a coil system of single turn as shown in FIGS. 3(a) and 3(b), where windings are arranged on the Y-axis of FIG. 2 in a manner quite different from the above-described prior art theory. (See U.S. patent application Ser. No. 714,580, filed on Mar 21, 1985.) FIG. 3(a) shows the shape after a conductive sheet has been blanked. FIG. 3(b) shows the condition in which the blanked sheet has been shaped into a cylindricl form. The coil system shown in FIGS. 3(a) and 3(b) comprise straight conductor portions 10 and 11 extending parallel to the Z-axis of the cylinder, first arc-shaped conductor portions 12 and 13 that connect together the straight portions 10 and 11 in series to form an annular conductor that constitutes a coil, second arc-shaped conductor portions 14, 15, 16, 17 which are similar in shape to the first arc-shaped portions 12, 13, and leads 18, 19 for connecting the coil to an external circuit. The second arc-shaped portions 14 and 15 are connected to the straight portion 10, while the second arc-shaped portions 16 and 17 are connected to the straight portion 11. The arc-shaped portions 15 and 16 are not connected together. Also, the arc-shaped portions 14 and 17 are not connected together. Therefore, these second arc-shaped portions 14–17 do not act as components of the coil. The first arc-shaped portions and the second, similarly shaped second portions are disposed symmetrically with respect to the center O of the cylindrical volume in which a sample is placed. Thus, the second arc-shaped portions are disposed to compensate for inhomogeneities of the static magnetic field.

The coil system shown in FIGS. 3(a) and 3(b) has only one turn and exhibits an inductance smaller than the inductance of the conventional coil system of two turns. In the single-turn coil, the straight conductor portions 10 and 11 that are components of the coil are disposed in the YZ-plane perpendicular to the axis of the RF field, or the X-axis. Since the straight portions 10 and 11 placed in this way feels the maximum value of strength of the RF magnetic field produced along the X-axis about the center O of the cylindrical volume, the coil should yield high Q. Consequently, the proposed coil system should exhibit small inductance and high Q. In practice, however, an actual tuning circuit incorporating such a coil system showed a Q lower than anticipated, for reasons explained below. In an actual NMR probe, the proposed coil system is placed at the center of the static magnetic field. Tuning capacitors are connected to leads which are brought out from this coil system to form a resonant circuit. That is, the capacitors are not directly attached to the coil system. Inductances of the leads and stray capacitance hindered the anticipated improvement in q of the tuning circuit, or the resonant circuit.

SUMMARY OF THE INVENTION

The main object of the invention is to provide a single-turn coil system that can yield sufficiently high Q.

Another object of the invention is to provide a plural-turn coil system that can yield sufficiently high Q.

These and other objects are achieved in accordance with the teaching of the invention by a coil system for an NMR spectrometer probe, the coil system comprising a coil portion wound around a cylindrical volume in which a sample is placed and two leads for connecting the coil portion to an external circuit, the coil portion acting to produce an RF magnetic field in a direction perpendicular to the axis of the cylindrical volume. The two leads have overlapped portions between which a dielectric is sandwiched, or plural members composing said coil portion have overlapped portions between which a dielectric is sandwiched. Thus, a capacitor is formed. Accordingly, the tuning capacitor is connected at a position very close to the coil. Hence, the Q of the tuning capacitor is made much higher than in the conventional case where tuning capacitors connected to leads brought out from the coil.

PREFERRED EMBODIMENTS OF THE INVENTION

Figure 1:
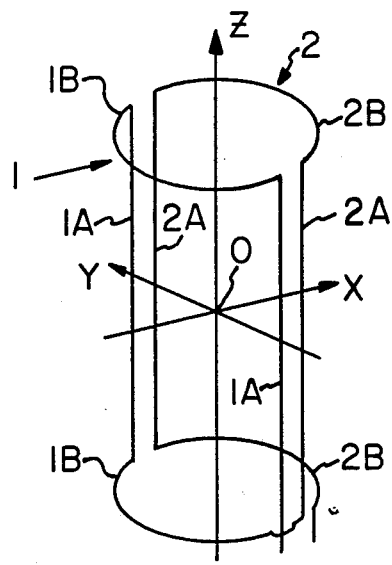
FIGS. 1 and 2 are schematic diagrams of a conventional saddle coil.
Figure 2:
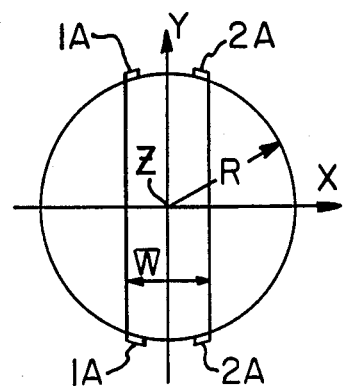
Figure 3A:
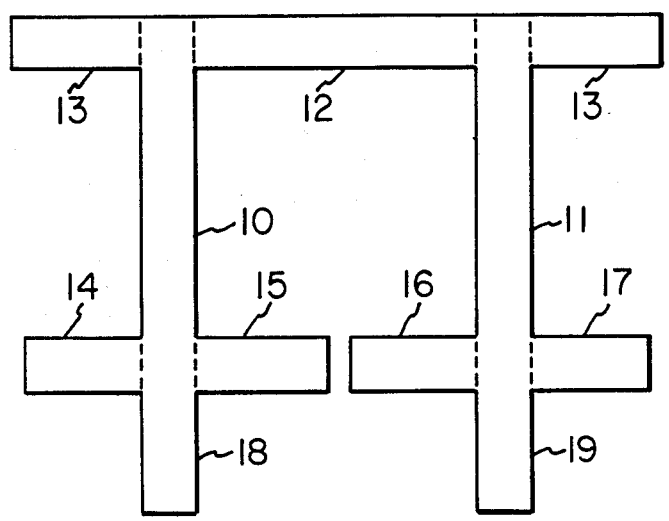
FIGS. 3(a) and 3(b) are views of the single-turn coil already proposed by the present inventor.
Figure 3B:
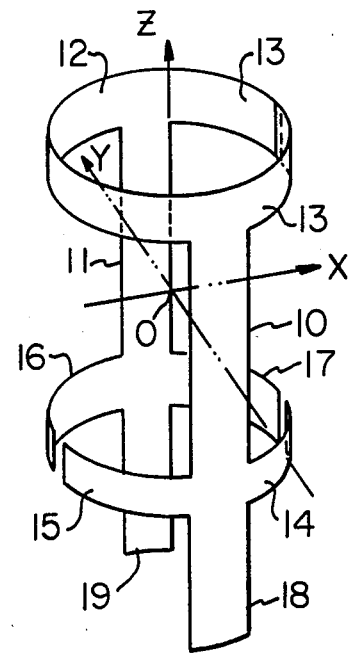
Figure 4:
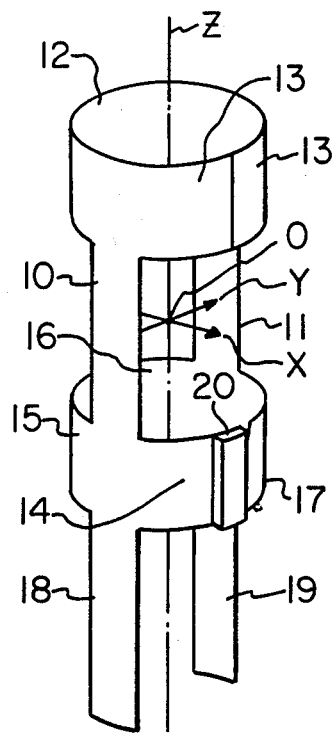
FIG. 4 is a perspective view of a coil system constructed in accordance with the invention for use with an NMR probe.
Figure 5:
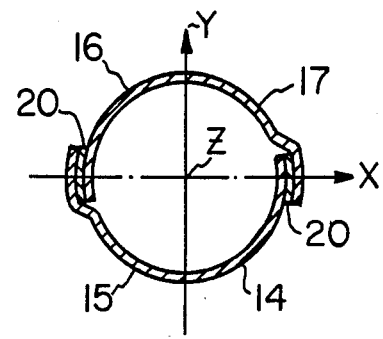
FIG. 5 is a cross-sectional view taken on a plane perpendicular to the Z-axis of the cylindrical volume of the coil system shown in FIG. 4 at positions of the second arc-shaped conductors 14–17.

Referring to FIG. 4, there is shown a coil system built in accordance with the invention for use with an NMR spectrometer probe. This coil system is similar to the coil system shown in FIG. 3(b) except that a capacitor is inserted between the arc-shaped conductors 14 and 17 and a second capacitor is inserted between the arc-shaped conductors 15 and 16. FIG. 5 is a cross-sectional view taken of a plane perpendicular to the Z-axis of the cylindrical volume of the coil system at the positions of the second arc-shaped conductors. As can be seen from FIG. 5, the arc-shaped conductors 14 and 17 overlap with each other, and the arc-shaped conductors 15 and 16 overlap with each other. A dielectric film 20 is inserted between the overlapped portions of the conductors 14 and 17 for electrical insulation. Also, another dielectric film 20 is inserted between the overlapped portions of the conductors 15 and 16 for electrical insulation. Thus, each pair of overlapped portions possesses capacitance on an X-axis and serves as a capacitor.

Figure 6:
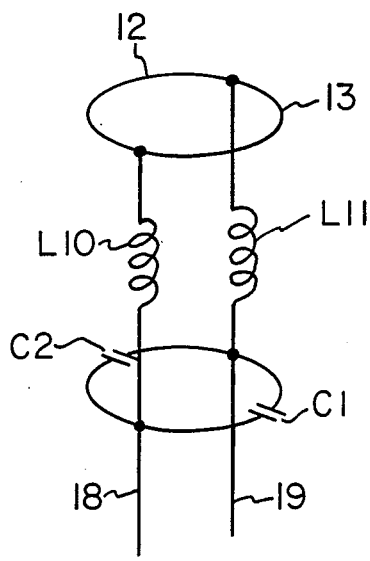
FIG. 6 is a diagram showing an equivalent circuit of the coil system shown in FIG. 4.

FIG. 6 shows an equivalent circuit of the coil system shown in FIG. 4. Inductances L10 and L11 are primarily formed by the straight conductors 10 and 11. The two dielectric films form capacitors C1 and C2, respectively. The inductances L10, L11 and the combination of the capacitors C1 and C2 constitute a parallel resonant circuit in which lead or the like does not exist between the coil and the capacitors, unlike the prior art coil system. Consequently, the tuning capacitors are incorporated in the coil system. Hence, the Q of the resonant circuit is quite high.

Figure 7:
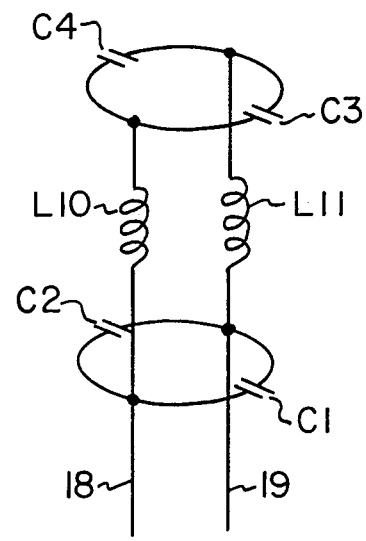
FIG. 7 is a diagram showing an equivalent circuit of another coil system according to the invention.

Another coil system according to the invention is shown in FIG. 7 in the form of an equivalent circuit. This coil system has first arc-shaped conductors 12 and 13 in the same manner as the structure shown in FIG. 4. So, capacitors C3 and C4 are connected in series with the coil. Since the inductance of the coil is considerably cancelled by the capacitors C3 and C4, the resonant frequency, or tuning frequency, of this coil system can be made higher than the resonant frequency of the coil system shown in FIG. 4.

Figure 8:
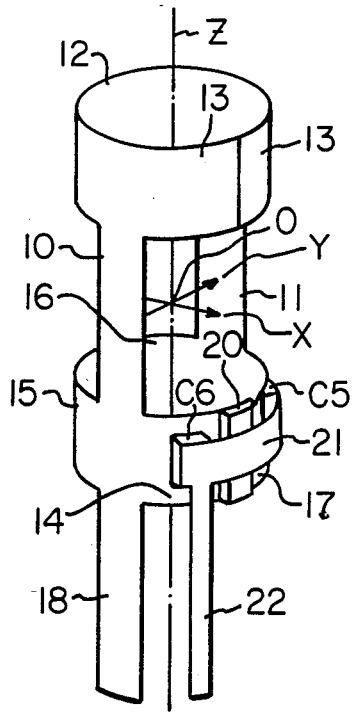
FIG. 8 is a perspective view of a further coil system according to the invention.

A further coil system according to the invention is shown in FIG. 8. This coil system consists of a structure shown in FIG. 4 together with commercially available small-sized chip capacitors C5 and C6 attached to the arc-shaped conductors 14 and 17, respectively. The capacitors C5 and C6 are connected with each other by a third arc-shaped conductor from which a lead 22 is brought out. Accordingly, the lead 19 used in the coil system shown in FIG. 4 is omitted from this coil system shown in FIG. 8.

Figure 9:
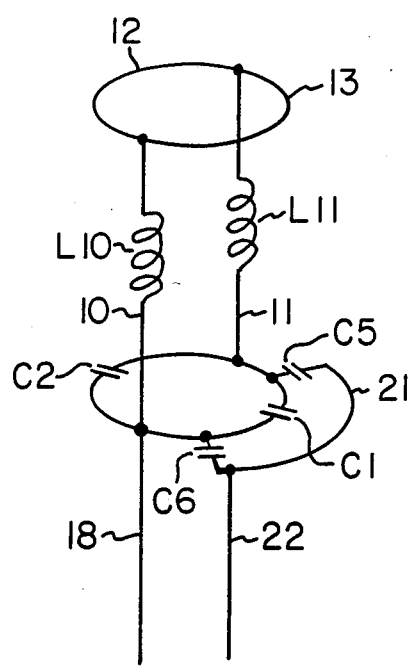
FIG. 9 is a diagram showing an equivalent circuit of the coil system shown in FIG. 8.

FIG. 9 shows an equivalent circuit of the coil system shown in FIG. 8. The inductance of the coil is considerably cancelled by the capacitors C5 and C6. Therefore, the resonant frequency or tuning frequency, of this coil system can be rendered higher than the resonant frequency of the coil system shown in FIG. 4.

Figure 10:
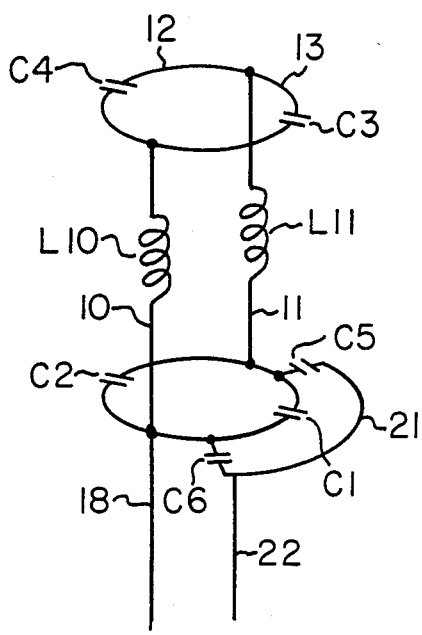
FIG. 10 is a diagram of an equivalent circuit of a still other coil system according to the invention.

FIG. 10 shows an equivalent circuit of a yet further coil system which is obtained by inserting capacitors C3 and C4 between the first arc-shaped conductors 12 and 13 of the coil system shown in FIG. 8, in the same way as the coil system shown in FIG. 7. This coil system shown in FIG. 10 can yield still higher resonant frequency, or tuning frequency.

Figures 11A, 11B:
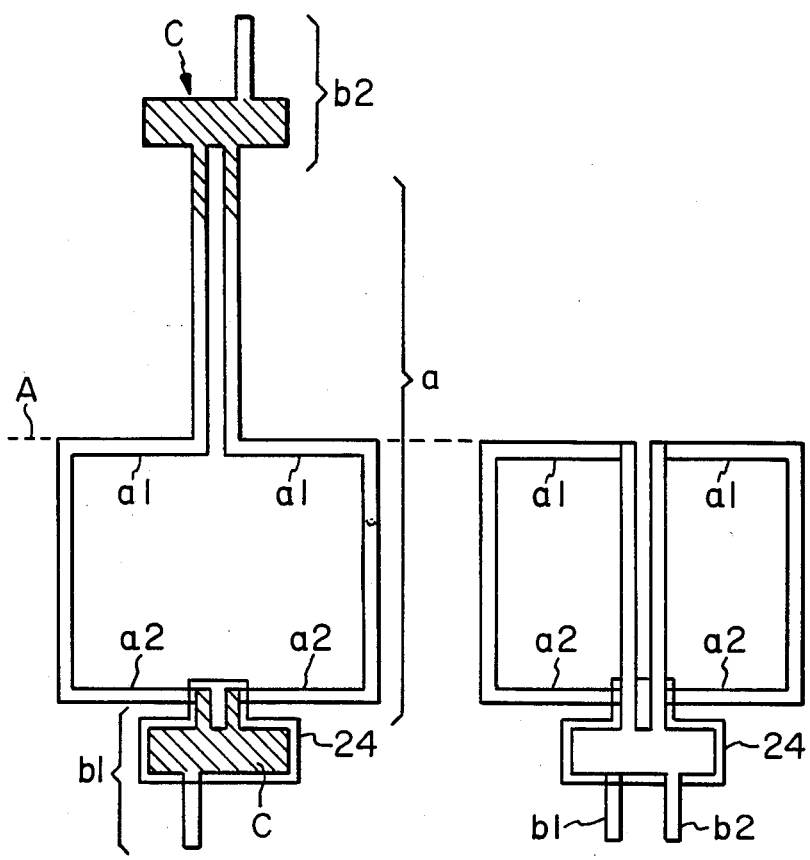
FIGS. 11(a) and 11(b) and 11(c) are the views of still other coil systems according to the invention.
Figure 11C:
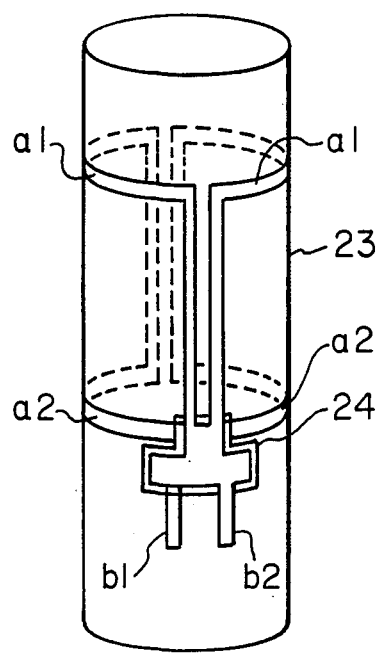

FIGS. 11(a)–11(c) show a plural-turn coil system according to the invention. FIG. 11(a) shows the condition in which a conductive sheet has bee blanked. The coil system comprises a coil portion and two leads b1 and b2. FIG. 11(b) shows the condition in which the coil system has been folded along the broken line A of FIG. 11(a). Then, portions a1 and a2 are bent along the curved surface of a cylinder 23 to form a coil of two turns wound parallel as shown in FIG. 11(c). The cylinder 23 is a jig used for fabricating the coil. A sample tube is inserted into the space occupied by this cylinder.

When the coil system is bent as shown in FIG. 11(b), the hatched portions c of the two leads overlap each other. A dielectric film 24 made from a high-molecular substance or the like is sandwiched between the overlapped portions for electrical insulation to form a capacitance therebetween, creating a capacitor.

Thus the tuning capacitor is mounted between the leads of the coil system, which consists of the coil portion and the leads. The capacitor is incorporated in the coil system. The Q of the tuning circuit can be made much higher than the Q of the conventional tuning circuit whose tuning capacitors are connected to leads brought out from a coil.

Figure 12A:
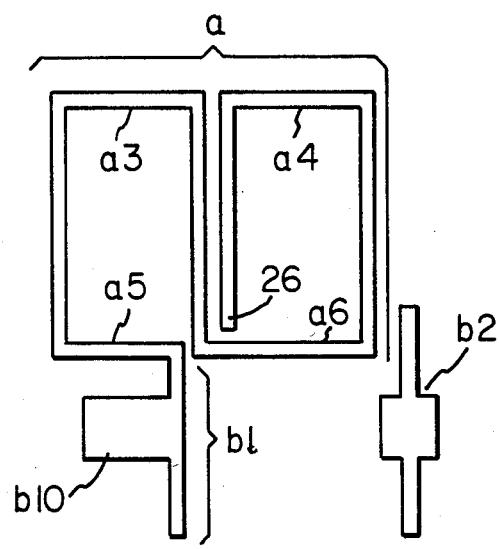
FIGS. 12(a) and 12(b) and 12(c) are the views of still other coil systems according to the invention.
Figure 12B:
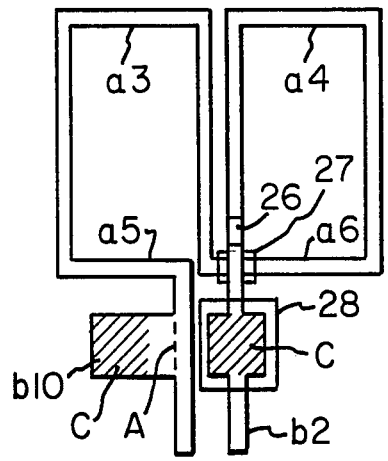
Figure 12C:
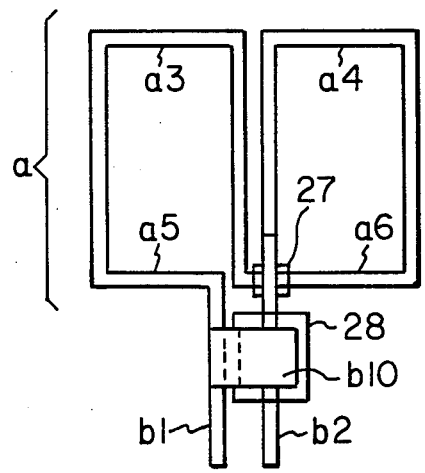

FIGS. 12(a)–12(c) show another coil system according to the invention. FIG. 12(a) shows the condition in which a conductive sheet has been blanked. In this example, lead b2 is fabricated independently, because the lead b2 crosses coil portion a6. As shown in FIG. 12(b), the lead b2 is connected to the end 26 of winding and extends outwardly of the coil in a parallel relation to lead b1. An insulating film 27 is sandwiched between the leads b2 and coil portion a6 at the position at which they cross each other, for electrical insulation.

When a portion b10 of the lead b1 is then bent back along the broken line A, the hatched portions c overlap the led b2 as shown in FIG. 12(c). A dielectric film 28 is sandwiched between the overlapped portions for electrical insulation. Subsequently, the system is wound along the curved surface of a cylinder in the same manner as in FIG. 12(c). Thus, a coil system of two turns wound in series is fabricated, and a tuning capacitor is incorporated in the coil system.

Of course, the capacitance of the capacitor formed between the leads can be adjusted at will by appropriately selecting the are of the overlapped portions, the dielectric material, and its thickness. Although the illustrated examples have two turns, the invention can also be similarly applied to coil having a larger number of turns. The inventive coil system can be fabricated by blanking a conductive sheet as mentioned already or by attaching conductive wire to a bobbin. In the latter case, independent sheet electrodes may be connected to the wire to increase the area of the overlapped portions.

In the examples described above, each capacitor consists of one dielectric film sandwiched between conductors. Of course, this capacitor may be replaced by a small-sized chip capacitor as used in the coil system shown in FIG. 8.

The inventive coil system can be fabricated by blanking a conductive sheet as mentioned above. Further, it may be fabricated by attaching conductor wire to a bobbin or by forming conductors on a bobbin by vacuum evaporation techniques. Also, it may be fabricated as a printed circuit on a board that may or may not be flexible.

In the above examples, the straight conductors are arranged accurately symmetrically with respect to the Z-axis, but it suffices to arrange them roughly symmetrically, slight asymmetry may be accepted.

As described in detail thus far, the novel coil system for an NMR spectrometer probe exhibits low inductance, accommodates up to higher frequencies, and allows the associated resonant circuit to show high Q. Further, the novel coil system can raise the frequency observed by the NMR spectormeter in which the coil system is used. Furthermore, the sensitivity can be enhanced conspicuously.

We claim:

1. An exciting and detecting coil system for an NMR spectrometer probe, the coil system comprising a coil portion wound around a cylindrical volume in which a sample is placed for producing an RF magnetic field in a direction perpendicular to the axis of the cylindrical volume, the coil system further having two leads for connecting the coil portion to an external circuit,
   said two leads overlapping each other adjacent the cylindrical volume, and a dielectric substance being sandwiched between the overlapped portions of the leads to form a capacitor.

2. In a coil system for an NMR spectrometer probe as set forth in claim 1, the further comprising each of the coil portions and the leads made of a sheet conductor.

3. An exciting and detecting coil system for an NMR spectrometer probe, the coil system being wound around a cylindrical volume in which a sample is placed, the coil system being adapted to produce an RF magnetic field in a direction perpendicular to the axis of the cylindrical volume, said coil system comprising:
   a pair of straight conductive portions extending parallel to the axis of the cylindrical volume and disposed substantially symmetrically with respect to the axis of the cylindrical volume;
   first arc-shaped conductive portions which connect together first ends of the straight conductive portions to form a coil;
   second discontinuous arc-shaped conductive portions which are similar in shape to the first arc-shaped conductive portions, which are connected to the other ends of the straight conductive portions and which have overlapped portions; and
   a dielectric substance being sandwiched between the overlapped portions of at least one of the second arc-shaped portions arranged adjacent to the cylindrical volume.

4. A coil system for an NMR spectrometer probe as set forth in claim 3, wherein the first arc-shaped portions are discontinuous and overlapped and dielectric substances are sandwiched between the two overlapped portions of the first arc-shaped portions.

5. A coil system for an NMR spectrometer probe as set forth in claims 3 or 4, wherein each of the conductive portions is made of a sheet conductor.

6. A coil system for an NMR spectrometer probe as set forth in claims 3 or 4, wherein each of the conductive portions is made of a sheet conductor, and wherein a dielectric film is sandwiched between said overlapped ends of the sheet conductors to form capacitors.

* * * * *